United States Patent [19]

Schildkraut et al.

[11] Patent Number: 4,720,155
[45] Date of Patent: Jan. 19, 1988

[54] DATABUS COUPLER ELECTRICAL CONNECTOR

[75] Inventors: Alan L. Schildkraut, Sidney; Alan L. Davis, Unadilla, both of N.Y.

[73] Assignee: Amphenol Corporation, Wallingford, Conn.

[21] Appl. No.: 848,110

[22] Filed: Apr. 4, 1986

[51] Int. Cl.⁴ ........................................ H01R 13/658
[52] U.S. Cl. ................................... 439/108; 439/608; 439/620
[58] Field of Search ............. 339/14 R, 143 R, 147 R, 339/147 P

[56] References Cited

U.S. PATENT DOCUMENTS

| | | | |
|---|---|---|---|
| 2,238,025 | 4/1941 | Miller | 339/147 P |
| 3,854,107 | 12/1974 | Tuchto et al. | 339/147 R |
| 4,020,430 | 4/1977 | Van Der Heyden | 339/147 R |
| 4,029,386 | 6/1977 | Krantz, Jr. et al. | 339/143 R |
| 4,109,222 | 8/1978 | Frano et al. | 339/143 R |
| 4,122,416 | 10/1978 | Oblak et al. | 339/143 R |
| 4,389,080 | 6/1983 | Clark et al. | 339/14 R |
| 4,431,251 | 2/1984 | Krantz | 339/143 R |
| 4,440,463 | 4/1984 | Gliha, Jr. et al. | 339/14 R |
| 4,519,666 | 5/1985 | Williams et al. | 339/177 R |
| 4,620,762 | 11/1986 | Davis et al. | 339/14 R |

FOREIGN PATENT DOCUMENTS 94628 8/1969 France ........................... 339/147 R

OTHER PUBLICATIONS

Copending Ser. No. 848,094, "DC-AC Inverter Connector", Frear et al., filed 4-4-86.
Proceedings, Seventh Aircraft/Stores Compatibility Symposium, Wright Patterson AFB, Ohio, Apr. 8-10, 1986, Meeting the Electrical Challenge at the Aircraft/Store Interface, Schildkraut and Luca.
Article, Jun. 1985 Issue RF Design, pp. 24-29; MIL. STD-1553: "A Viable Interface Standard" S. Friedman.
Advertisement, North Hills Electronics, "MIL STD 1553B Data Bus Couplers".
Advertisement, Technitrol, "MIL STD 1553 Data Bus Couplers".

Primary Examiner—John McQuade
Attorney, Agent, or Firm—Bacon & Thomas

[57] ABSTRACT

An electronic circuit component and a plurality of twinax contacts are connected together in piggy-back fashion and enclosed within a metallic frame with respective signal paths in the component and contacts being interconnected such that an apertured ground plate completes a 360° electrically conductive seal around the contacts and grounds the contacts in common to the metallic frame. The plate also prevents axial leakage of electromagnetic energy from interrupting the electronic component.

9 Claims, 2 Drawing Figures

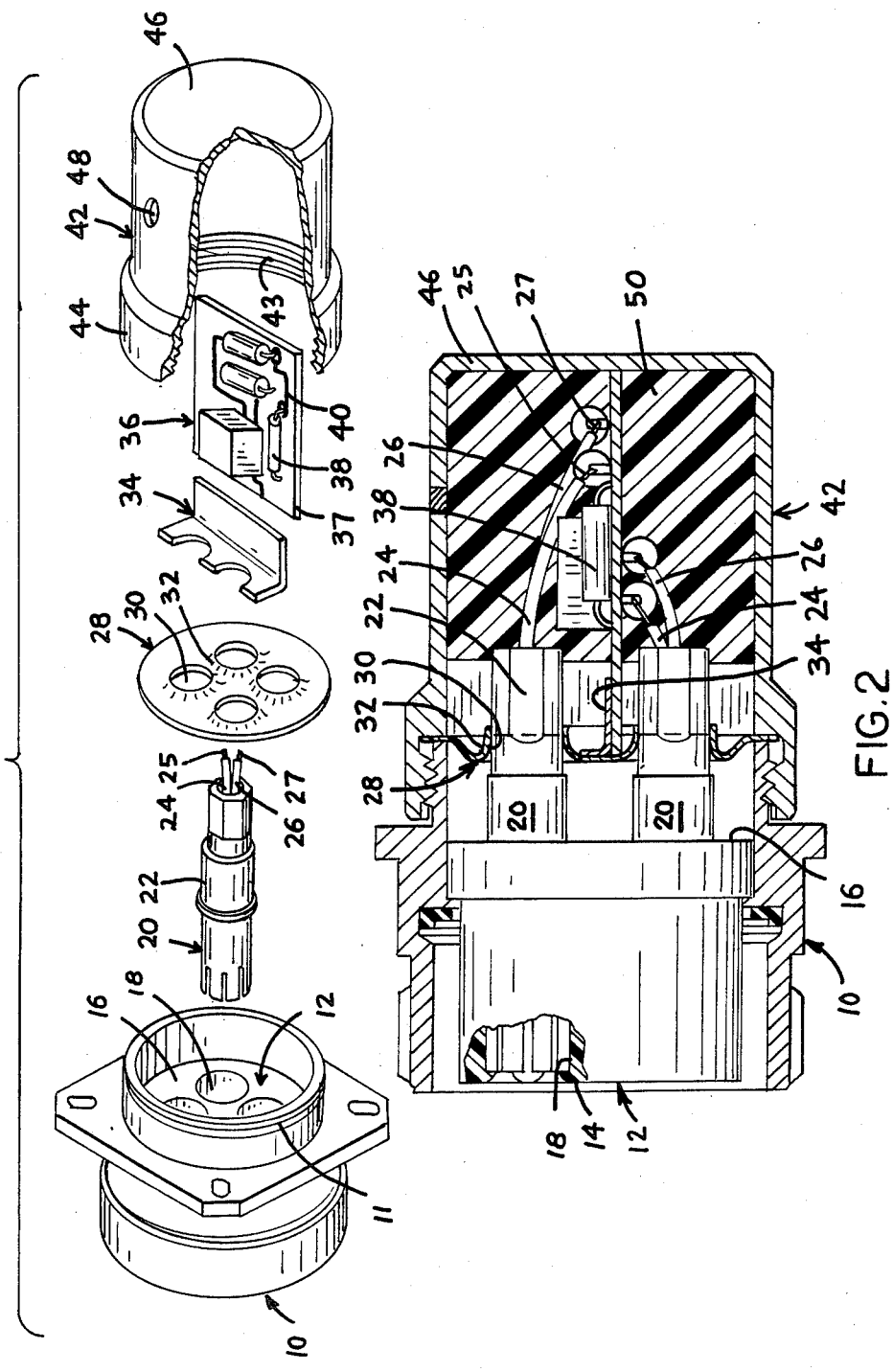

DATABUS COUPLER ELECTRICAL CONNECTOR

This invention relates to a databus coupler electrical connector.

Connector assemblies including a plurality of matable connector shells on a single housing are known. Connector shells are oftentimes very expensive and thus elimination of redundant shells would reduce cost, number of parts required to assemble a connector, and complex mounting patterns required on the housing necessary to accept these shells. Further, the connector shells are oftentimes disposed in orthogonal directions thus requiring planar installations and larger access areas for receiving mating shells.

Current aircraft applications require rapid transmission of low power electrical signals along paths between opposite ends of the aircraft. A bus is the main information line and a databus typically includes an input, an output, and at least one branch point for splitting a signal without attenuation of the signal strength, such being the case with a databus coupler. MIL-STD 1553B governs a serial databus for multiplexed digital data to perform the functions of command, control, communication and intelligence, the bus transmitting information among several sources connected by a single, twisted, shielded pair of wires, the cable shield protecting the transmitted multiplexed data from magnetic and electrostatic interference. By using a digital multiplex bus, smaller and lighter cables can be utilized instead of complicated, heavy, and dedicated cabling.

However, many databus couplers have not been qualified to severe environmental and other requirements required of shells such as MIL-C-38999 let alone MIL-STD-1553B. A coupler should desirably be intermatable with connectors presently used in the industry. Further, while it is known to use shielded cable and to shield a termination from electromagnetic effects, there are many paths through which undesirable frequency can travel. Not all connectors and/or couplers supply this protection against electromagnetic effects.

It would be desirable to provide a databus coupler which is compact, short, electromagnetically sealed, and mounts the electronic signal processing component coaxially rearward of a plurality of terminable contacts each of which being disposed in a single connector shell.

In accordance with this invention, the databus coupler comprises a connector shell and a housing each being of an electrically conductive material and connected together along a common axis in piggy-back fashion, the shell carrying a plurality of concentric twinax electrical contacts each including an outer conductor encircling a pair of dielectrically separated inner conductors each terminated to the center conductor in a respective insulated cable, the housing enclosing therewithin an electrical circuit component wherein terminals thereof are electrically interconnected to respective of the cable conductors, a shielded ground plane interconnects in common each of the outer conductors of the contacts, and conductive sealing means complete a 360° electrical seal circumferentially around and axially between the shell, the housing, the ground plane, and the contacts whereby to protect and ground the electrical signals from electromagnetic effects.

One advantage of such a coupler is provision of a plurality of signal ports in a single connector shell, each being shielded from electromagnetic effects both axially and 360° radially therearound. The contacts are disposed in a close array and in parallel relation thereby allowing an axial shortening of the package, and a reduction in the number of electrical connector shells necessary to interconnect the electronic component to the main bus.

One way of carrying out the invention is described below with reference to the drawings which illustrate the invention and in which:

FIG. 1 shows an exploded assembly view of a databus coupler.

FIG. 2 shows a side view in section of the assembled databus coupler.

Turning now to the drawings, FIG. 1 shows a cylindrical connector shell 10 comprised of metal, a concentric twinax terminal 20, a ground plane comprising a circular metal plate 28 including an array of apertures 30, a metallic mounting bracket 34, an electronic element 36 comprising electronic components 38 mounted on an electronic printed circuit board 37 including circuit paths 40 which interconnect respective of the components thereon, a cylindrical backshell housing 42 comprised of metal and having an internal thread 43. Although shown best in FIG. 2, separate conductors 25, 27 in insulated cables 24, 26 extend from their respective terminations to the inner conductors in one terminal to electrically interconnect with a respective circuit path on the printed circuit board 37.

The connector shell 10 is of electrically conductive material and includes a mating forward end portion and a rearward backshell having external thread 11 and defining a connectable rearward end portion. A dielectric insert 12 (see FIG. 2) is mounted in the shell, the insert including a forward end face 14, a rearward end face 16, and a plurality of cylindrical axial passages 18 extending between the faces each being sized to receive a twinax terminal inserted therein.

The twinax terminal 20 is generally cylindrical and has a forward end portion for mating, a rearward end portion for terminating to an electrical conductor or for further interconnection, and a collar medially of its ends for mounting the terminal into its respective passage. The terminal 20, while not shown in detail, is known and comprises three electrical conductors including an outer conductor in the form of an electrically conductive sleeve which encircles a pair of electrically conductive inner conductors, the conductors each being concentric to one another and the inner conductors being carried in the sleeve in electrical isolation to one another. Typically, one of the inner conductors is a pin member and the other is a receptacle member, each of the inner conductors being disposed in side-by-side concentric relation with a mating contact juxtaposing its corresponding pin and receptacle members.

As shown, four terminals could be received by the insert with two terminals being dedicated to input and output and the third and fourth being dedicated to defining branch points for tapping into the main bus line without substantial attenuation loss in signal strength. Three terminals would also work depending on the application.

The electrically conductive ground plane comprises a thin metallic circular plate 28 which includes a bottom face, a top face, and an array of upsets 32 each terminating in an aperture 30, the top face being adapted to face (and possibly abut) the rearward end face 16 of the insert 12, the apertures being positioned to register with respective of the passages 18. The apertures are formed by the plate being upset at four locations so that deformed portions of the plate will extend upwardly from the bottom face and extend radially inward whereby to form a constricted opening sized to interference fit 360° around the outer periphery of the terminal sleeve (i.e., the outer conductor) inserted therethrough. The outer radial margin of the plate is adapted to be axially captivated and complete a 360° metal-to-metal seal between the end faces of the externally threaded shell 12 and the internally threaded backshell housing 42.

The mounting bracket 34 is of metal and is bent into a right angle to form two legs with one leg including along its top edge a pair of semi-circular cut-outs each being greater in diameter than the upsets such that the cut-outs fit about respective of the upsets, and the other leg being adapted to support the circuit board. The bracket has its one leg welded (or otherwise intimately joined) to the circular plate whereby to form an electrical ground path therewith. The other leg is mounted to the circuit board whereby to form an electrical ground path with an electrical circuit path on the circuit board.

The electronic circuitry component 36 comprises a generally rigid circuit board 37 adapted to be mounted onto the bracket 34 and includes a plurality of signal carrying electrical circuit paths 40 and respective circuit components 38 dedicated of which being adapted to be electrically interconnected with respective of the terminals 20. The ground plane would complete a 360° electrical seal between the circuitry component and the backshell housing.

The backshell housing 42 is of electrically conductive material, cylindrical, and has a forward shell portion 44 internally threaded at 43 whereby to threadably engage with the connector shell 12. An endwall 46 forms a completely closed chamber for receiving and enclosing the circuit board and the terminations between the terminals and the cables.

FIG. 2 shows an assembled databus coupler. The backshell housing 42 is threadably connected to the connector shell 12 whereby to axially captivate the outer radial margin of the ground plate 38 therebetween. To ensure that electromagnetic interference does not pass through the threads and reach the chamber, a 360° electrically conductive seal is assured by further adding conductive sealant into and around the thread form. Other known joining methods can be used instead of threads.

The rearward end portion 22 of the respective terminal 20 upon being inserted into its aperture 30 is engaged in an interference fit by the respective upset 32 whereby to provide a 360° electrical seal around the sleeve (i.e., the outer conductor) of the terminal. The termination between each inner conductor and the respective cable conductor 25, 27 is axially rearward of the ground plate 28 and enclosed in the metal chamber defined by the backshell housing 42.

Because of the side view, two of four twinax terminals are shown each being terminated by two insulated conductors with the respective conductors then being electrically terminated to a component or circuit path on the circuit board. Each cable conductor is terminated at one respective end to an inner conductor in one terminal and at the other respective end to a preselected circuit path or circuit component on the printed circuit board.

Once the circuit board 36, mounting bracket 34, and ground plate 28 are assembled rearwardly of the connector shell 12, the backshell housing 42 is threadably engaged to electromagnetically seal the circuit board 36 therewithin. Dielectric material 50 (e.g., a potting compound) is then injected into the backshell housing 42 so as to embed the circuit board 36 and the rearward end portions 22 of the terminals 20 including their terminations to the wires 24, 26. To accomplish this one or more openings 48 are provided in the backshell housing to receive the dielectric material injected therethrough. Following the embedding step, the openings 48 would be closed with a conductive plug to assure that a complete metallic enclosure is provided about the circuit board.

Having thus described the invention what is claimed is:

1. A databus coupler comprising an electrically conductive enclosure which has an opening leading to a closed chamber, a dielectric insert having a rear face disposed in said opening and including an array of axial passages each extending through the insert, an electronic component completely enclosed by said chamber and including a plurality of circuit paths each for transmitting a communication signal, a matable terminal mounted in each said passage each terminal including an electrically conductive outer conductor encircling a pair of electrically conductive inner conductors, each said conductor having a rearward end portion extending rearwardly of said rear face and into said chamber, conducting means for electrically connecting the rearward end portion of one respective inner conductor with one respective circuit path, and grounding means engaging the rearward end portion of the outer conductors for electrically sealing the chamber and grounding the coupler to prevent electromagnetic frequency interference from entering or leaving the chamber, the grounding means completing a common electrical circuit path between the outer conductors of all said terminals, said enclosure, and the electronic component whereby to protect the inner conductors from electromagnetic frequency interference.

2. The databus coupler as recited in claim 1 wherein said grounding means includes an electrically conductive plate provided with a plurality of axially extending upsets each registering with one said passage and terminating in a constricted aperture for receiving the rearward end portion of the terminal associated with the passage, each upset being adapted to interference fit around the outer conductor whereby to complete a 360° electrically conductive seal about the terminal.

3. The databus coupler as recited in claim 2 wherein the enclosure comprises a shell and a chambered housing, the shell including a matable forward portion and a connectable rearward portion, the housing having a forward end portion connected to the connectable rearward portion of the shell in piggy-back relation and a rearward portion defining an endwall closing the chamber, and the grounding plate is captivated axially between the shell and the housing, said conducting means, said circuit component, and the rearward end portions of said terminals being disposed in the chamber axially rearward of the grounding plate.

4. The databus coupler as recited in claim 2 wherein said conducting means comprises a plurality of insulated wires each having one end terminated to one respective inner conductor and the other end terminated to one circuit path on the electrical component, the outer conductor defining a cylindrical sleeve concentrically encircling the inner conductors.

5. The databus coupler as recited in claim 4 wherein said rearward end portions and the respective terminations to said wires are disposed rearwardly of said plate, and including means comprised of a dielectric material for embedding the terminated end portions and the circuit component in the chamber.

6. The databus coupler as recited in claim 2 wherein a conductive bracket is in electrical circuit relation to said plate and a circuit path on said electrical component to complete a ground path therebetween.

7. The databus coupler as recited in claim 6 wherein said plate includes at least three upsets having corresponding apertures two thereof being dedicated to defining an input and an output to the coupler and the third being dedicated to defining a databus branch point.

8. In combination, an electrically conductive shell and an electrical circuit component, said shell including a plurality of electrical contacts, mounting means for mounting the contacts in the shell, grounding means for establishing an electrical ground path between each said contact and the shell, and said circuit component including a plurality of electrical signal paths each being connected electrically and mechanically to respective of said contacts, the improvement characterized by said circuit component and said shell being disposed along a common axis and connected in piggy-back relation, the contacts each being mounted such that its axis is parallel to the common axis and each including an outer conductor encircling a pair of inner conductors, and conductive sealing means for completing an electrically conductive seal between the shell, the contacts, and said circuit component, said sealing means comprising an electrically conductive housing enclosing the circuit component and in electrical circuit path relation to the shell, and a flat plate of electrically conductive material completing a 360° electrically conductive seal between its outer margin, the housing, and the shell, said plate including a plurality of axial upsets each forming a radially constricted aperture for receiving one respective contact therethrough and completing a 360° electrically conductive seal around the outer periphery thereof.

9. The invention as recited in claim 8 wherein a conductive cable electrically interconnects respective ones of the circuit paths with ones of the inner conductors, said cable terminations being axially rearward of said plate.

* * * * *